US010115465B2

(12) United States Patent
Ghodsi

(10) Patent No.: US 10,115,465 B2
(45) Date of Patent: Oct. 30, 2018

(54) FUNCTIONAL DATA PROGRAMMING IN A NON-VOLATILE MEMORY

(71) Applicant: MICRON TECHNOLOGY, INC., Boise, ID (US)

(72) Inventor: Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/479,520

(22) Filed: Apr. 5, 2017

(65) Prior Publication Data

US 2017/0206967 A1 Jul. 20, 2017

Related U.S. Application Data

(60) Continuation of application No. 15/233,097, filed on Aug. 10, 2016, now Pat. No. 9,620,234, which is a division of application No. 13/196,938, filed on Aug. 3, 2011, now Pat. No. 9,449,692.

(51) Int. Cl.
*G11C 16/10* (2006.01)
*G11C 16/34* (2006.01)

(52) U.S. Cl.
CPC .......... *G11C 16/10* (2013.01); *G11C 16/3427* (2013.01)

(58) Field of Classification Search
CPC .............................. G11C 16/10; G11C 16/26
USPC ........................................ 365/185.18, 185.24
See application file for complete search history.

(56) References Cited

U.S. PATENT DOCUMENTS

| | | | | |
|---|---|---|---|---|
| 3,744,037 | A * | 7/1973 | Spence | G11C 11/402 365/149 |
| 5,553,002 | A * | 9/1996 | Dangelo | G01R 31/31704 714/E11.167 |
| 5,924,115 | A * | 7/1999 | Von Herzen | G06F 12/06 711/117 |
| 5,969,982 | A * | 10/1999 | Koo | G11C 11/22 365/145 |
| 6,307,236 | B1 * | 10/2001 | Matsuzaki | H01L 21/82345 257/392 |
| 6,996,004 | B1 | 2/2006 | Fastow et al. | |
| 7,388,781 | B2 | 6/2008 | Litsyn et al. | |
| 7,450,420 | B2 | 11/2008 | Sinclair et al. | |
| 7,558,109 | B2 | 7/2009 | Brandman et al. | |
| 7,590,795 | B2 | 9/2009 | Sinclair et al. | |
| RE42,144 | E * | 2/2011 | Lisart | G11C 16/26 365/100 |
| 7,911,835 | B2 | 3/2011 | Kim et al. | |
| 7,990,766 | B2 | 8/2011 | Litsyn et al. | |
| 8,027,194 | B2 | 9/2011 | Lee et al. | |
| 8,050,086 | B2 | 11/2011 | Shalvi et al. | |

(Continued)

*Primary Examiner* — Michael Tran
(74) *Attorney, Agent, or Firm* — Dicke, Billig & Czaja, PLLC

(57) ABSTRACT

Methods of operating a memory include receiving a plurality of digits of data, determining a value of the plurality of digits of data, and selecting a function to represent the value of the plurality of digits of data. The selected function is a function of a cell number of each memory cell within a grouping of memory cells. The methods further include determining a desired threshold voltage of a particular memory cell of the grouping of memory cells corresponding to the value of the selected function for the cell number of the particular memory cell, and programming the particular memory cell to its desired threshold voltage.

21 Claims, 7 Drawing Sheets

(56) References Cited

U.S. PATENT DOCUMENTS

| | | | |
|---|---|---|---|
| 8,085,590 B2 | 12/2011 | Litsyn et al. | |
| 8,274,827 B2 | 9/2012 | Shirota et al. | |
| 8,402,217 B2 | 3/2013 | Burd | |
| 8,411,510 B2 | 4/2013 | Son et al. | |
| 2001/0045844 A1* | 11/2001 | New | H03K 19/17728 326/38 |
| 2005/0223152 A1* | 10/2005 | Sugawara | G11C 7/1048 710/316 |
| 2006/0076418 A1* | 4/2006 | Ostertun | G11C 5/04 235/492 |
| 2006/0288131 A1* | 12/2006 | Lee | G11C 7/04 710/29 |
| 2008/0054489 A1* | 3/2008 | Farrar | H01L 23/3121 257/777 |
| 2008/0084758 A1* | 4/2008 | Wang | G11C 7/067 365/185.21 |
| 2008/0117688 A1* | 5/2008 | Park | G11C 16/344 365/185.22 |
| 2008/0278923 A1* | 11/2008 | Losavio | H01L 25/0657 361/803 |
| 2009/0116290 A1* | 5/2009 | Yamada | G11C 16/28 365/185.17 |
| 2009/0244988 A1* | 10/2009 | Ashizawa | G11O 5/063 365/189.05 |
| 2009/0254718 A1* | 10/2009 | Biscondi | G06F 9/30018 711/154 |
| 2009/0296498 A1* | 12/2009 | Nakadai | G11C 8/14 365/189.011 |
| 2010/0008139 A1* | 1/2010 | Bae | G11C 11/005 365/185.03 |
| 2010/0115376 A1* | 5/2010 | Shalvi | G06F 11/1068 714/763 |
| 2010/0254184 A1* | 10/2010 | Tsukada | G11C 7/1006 365/163 |
| 2010/0290275 A1* | 11/2010 | Park | G11C 11/5678 365/163 |
| 2011/0047325 A1* | 2/2011 | Mishima | G11C 16/0475 711/103 |
| 2011/0242872 A1* | 10/2011 | Hanzawa | G11C 7/18 365/51 |
| 2011/0307750 A1* | 12/2011 | Narayanan | G01B 31/318547 714/729 |

* cited by examiner

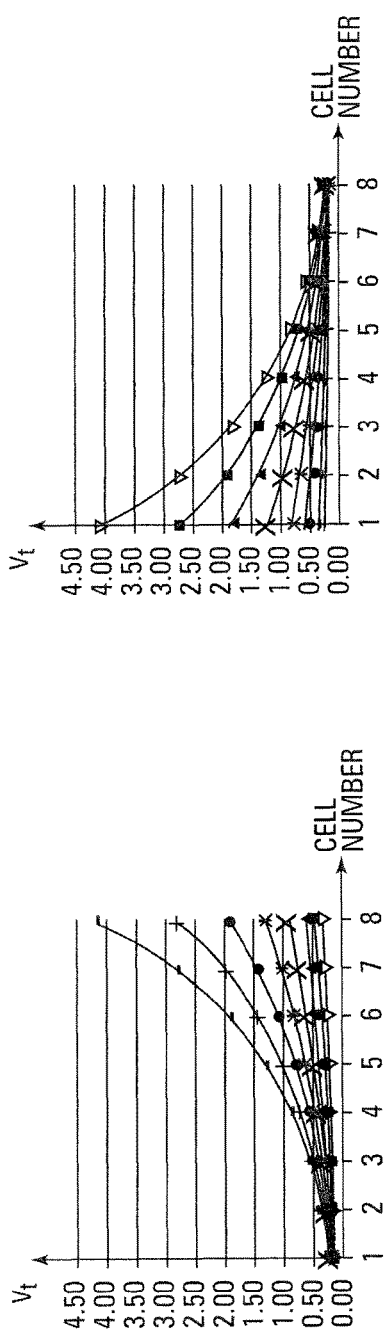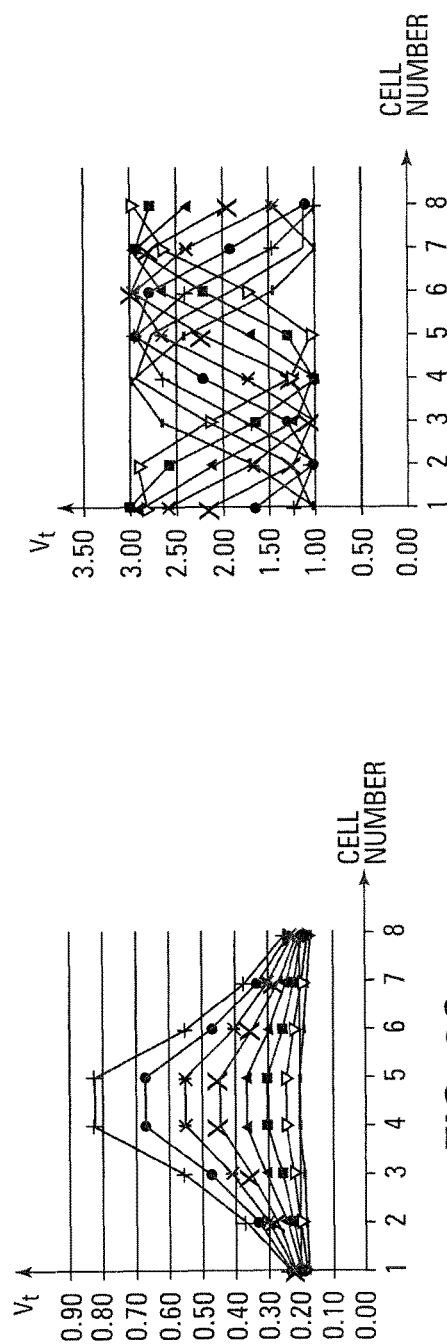

| A | B | m=1 b(1) | m=2 b(2) | m=3 b(3) | m=4 b(4) | m=5 b(5) | m=6 b(6) | m=7 b(7) | m=8 b(8) | FUNCTION | NUMBER OF BITS |
|---|---|---|---|---|---|---|---|---|---|---|---|
| 0.1667 | 0.05 | 0.18 | 0.18 | 0.19 | 0.20 | 0.21 | 0.23 | 0.24 | 0.25 | 1 | 0.00 |
| 0.1667 | 0.1 | 0.18 | 0.20 | 0.23 | 0.25 | 0.27 | 0.30 | 0.34 | 0.37 | 2 | 1.00 |
| 0.1667 | 0.15 | 0.19 | 0.23 | 0.26 | 0.30 | 0.35 | 0.41 | 0.48 | 0.55 | 3 | 1.58 |
| 0.1667 | 0.2 | 0.20 | 0.25 | 0.30 | 0.37 | 0.45 | 0.55 | 0.68 | 0.83 | 4 | 2.00 |
| 0.1667 | 0.25 | 0.21 | 0.27 | 0.35 | 0.45 | 0.58 | 0.75 | 0.96 | 1.23 | 5 | 2.32 |
| 0.1667 | 0.3 | 0.23 | 0.30 | 0.41 | 0.55 | 0.75 | 1.01 | 1.36 | 1.84 | 6 | 2.58 |
| 0.1667 | 0.35 | 0.24 | 0.34 | 0.48 | 0.68 | 0.96 | 1.36 | 1.93 | 2.74 | 7 | 2.81 |
| 0.1667 | 0.4 | 0.25 | 0.37 | 0.55 | 0.83 | 1.23 | 1.84 | 2.74 | 4.09 | 8 | 3.00 |

FIG. 5

FUNCTIONAL DATA PROGRAMMING IN A NON-VOLATILE MEMORY

RELATED APPLICATIONS

This Application is a Continuation of U.S. patent application Ser. No. 15/233,097, titled "FUNCTIONAL DATA READING IN A NON-VOLATILE MEMORY," filed Aug. 10, 2016, now U.S. Pat. No. 9,620,234 issued on Apr. 11, 2017, which is a Divisional of U.S. patent application Ser. No. 13/196,938, titled "FUNCTIONAL DATA PROGRAMMING AND READING IN A MEMORY," filed Aug. 3, 2011, now U.S. Pat. No. 9,449,692 issued on Sep. 20, 2016, which are commonly assigned and incorporated herein by reference.

TECHNICAL FIELD

The present invention relates generally to memory and a particular embodiment relates to functional data programming in non-volatile memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A flash memory is a type of memory that can be erased and reprogrammed in blocks instead of one byte at a time. A typical flash memory comprises a memory array organized in columns and rows. Changes in threshold voltage of the memory cells, through programming of charge storage structures (e.g., floating gates or charge traps) or other physical phenomena (e.g., phase change or polarization), determine the data value of each cell. The cells are usually grouped into blocks. Each of the cells within a block can be electrically programmed, such as by charging the charge storage structure. The data in a cell of this type is determined by the presence or absence of the charge in the charge storage structure. The charge can be removed from the charge storage structure by an erase operation.

As the physical size of memory arrays is decreased in order to increase the density of memory devices, the reduced proximity of the memory cells can result in problems with capacitive coupling. For example, charge storage structure-to-charge storage structure (e.g., floating gate-to-floating gate) capacitive coupling between adjacent memory cells can cause the programming of one memory cell to "pull-up" the threshold voltage of an adjacent memory cell to a higher threshold voltage. This coupling can result in errors reading the affected memory cell since its threshold voltage can be increased beyond a normal target voltage for a particular programmed state.

Some types of read errors can be corrected by error correction coding (ECC). However, ECC uses additional controller time that could be used for other functions and can take up additional memory locations in the memory array that can be used as user memory.

For the reasons stated above and for other reasons stated below that will become apparent to those skilled in the art upon reading and understanding the present specification, there is a need in the art to reduce the impact of charge storage structure-to-charge storage structure coupling in memory.

BRIEF DESCRIPTION OF THE DRAWINGS

FIGS. 2A-2D show graphs of embodiments of possible functions in accordance with the functional data programming of the present disclosure.

FIG. 5 shows a table of threshold voltages resulting from one embodiment of a functional encoding of data.

DETAILED DESCRIPTION

Figure 1:
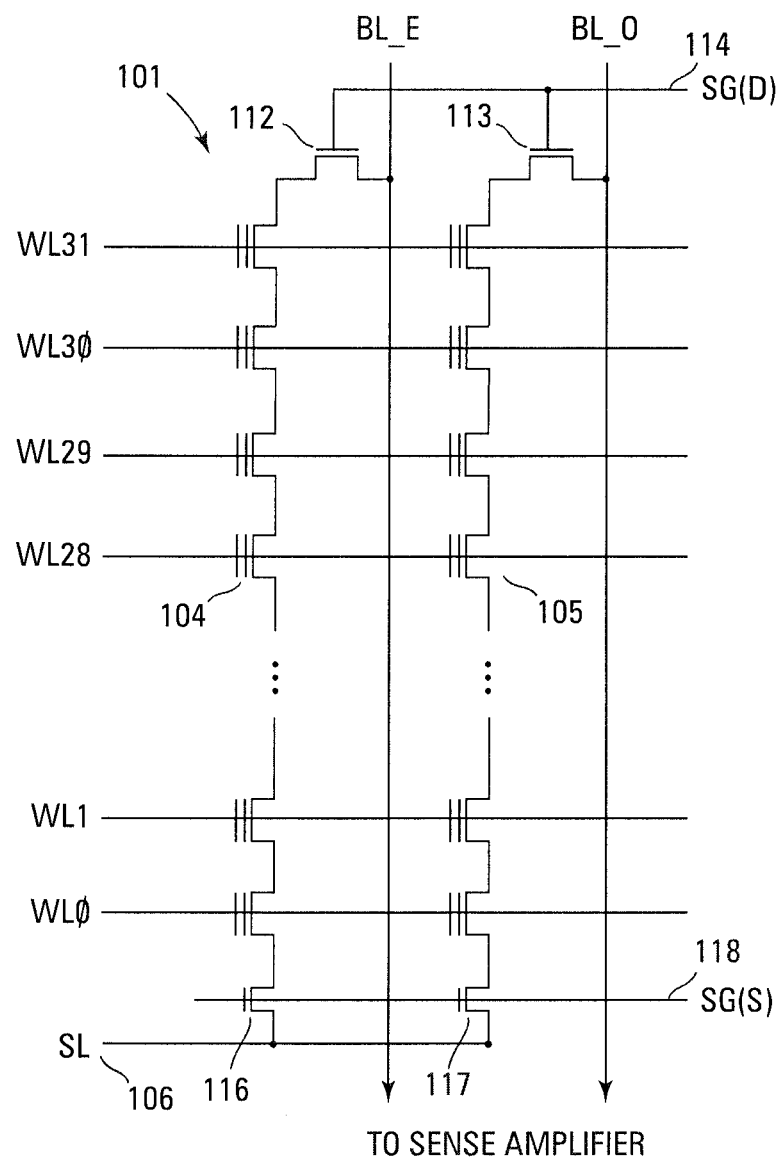
FIG. 1 shows a schematic diagram of one embodiment of a portion of a memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101 comprising series strings of non-volatile memory cells. The present embodiments of the memory array are not limited to the illustrated NAND architecture. Alternate embodiments can use NOR or other architectures as well.

The memory array 101 comprises an array of non-volatile memory cells (e.g., floating gate) arranged in columns such as series strings 104, 105. Each of the cells is coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry (such as sense amplifier circuitry) that detects the state of each cell by sensing current or voltage on a selected bit line.

Each series string 104, 105 of memory cells is coupled to a source line (SL) 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

In a typical prior art programming of the memory array, each memory cell is individually programmed as either a single level cell (SLC) or a multiple level cell (MLC). The prior art uses a cell's threshold voltage ($V_t$) as an indication of the data stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multiple level cells can take advantage of the analog nature of a traditional flash cell by assigning a bit pattern to a specific $V_t$ range.

Instead of using individual memory cells as isolated information node storage, the present embodiments for functional data programming use a functional relationship between a group of memory cells. The group can be along a word line, along a bit line, or a matrix of both. As subsequently described in greater detail, the data to be stored is encoded with a mathematical function that can be expressed as fi(m), where "m" is an integer number of cells and "i" is an integer number of functional variations.

For example, m=3 signifies that three physical memory cells will be used to store one of eight different functional variations signified by i=1, 2, . . . , 8. Thus each function denoted by i=1 to i=8 will represent eight variations of mathematical functions resulting in 3 bits of binary data. That is, i will have max value L (in this case L=8) to result in storing n-bits of binary data (in this case n=3) within m physical cells (in this case m=3). One could store n=3 bits of data on m=4 physical cell to reduce probability of error at extra memory cost or store n=5 bits of information on m=4 physical cells for a more cost effective storage. In this case $L=2^5=32$ different functional variations will be needed to store 5 bits on 4 physical cells.

FIGS. 2A-2D illustrate four possible embodiments of functions that can be used to program into groups of memory cells. These functions are for purposes of illustration only as other functions can be used.

The illustration of the group of memory cells comprising eight memory cells is also used for purposes of illustration. Alternate embodiments can use other quantities of memory cells in the group of memory cells that represent the data being programmed. In one embodiment, a number of memory cells can be chosen to create a balance between function resolution, error sensitivity, and storage density.

Each of the functions of FIGS. 2A-2D use groups of eight memory cells to achieve eight bits of data. This needs $2^8=256$ variations of a function(s) to be stored. The Y-axis of each function represents the threshold voltage ($V_t$) levels for each individual memory cell. The X-axis represents the memory cell's number, or other designation, with an assigned point in the particular illustrated function. Each plot of each graph represents a different variation of the particular function represented in its respective graph.

For example, FIG. 2A illustrates a graph of an increasing exponential function. This graph can be represented by the function $Ae^{(B*m)}$ where A and B are constants that can be chosen by empirical testing to find the best error correction and noise immunity and m is the number of cells being programmed. This graph is discussed in greater detail with reference to the table of FIG. 5. The remaining graphs illustrated in FIGS. 2B-2D illustrate different functions in substantially the same manner.

FIG. 2B illustrates a graph of a decreasing exponential function. FIG. 2C illustrates a graph of a combination of both of the embodiments of FIGS. 2A and 2B. FIG. 2D illustrates a periodic function.

Figure 3:
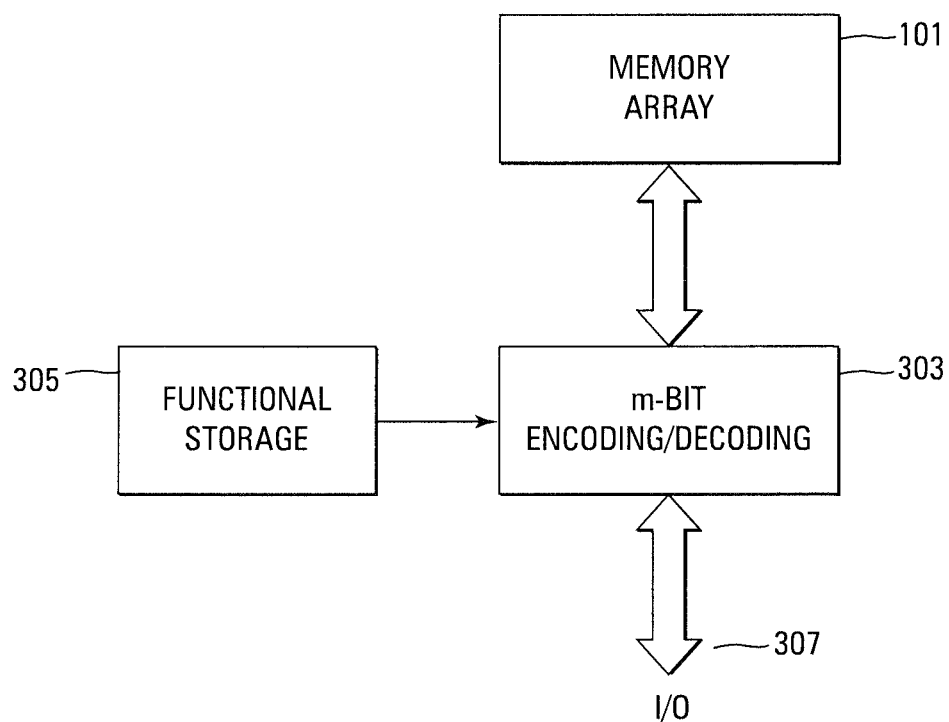
FIG. 3 shows a block diagram of one embodiment of an encoding and decoding block as used with the memory array of FIG. 1.

FIG. 3 illustrates a block diagram of one embodiment of an encoding and decoding block 303 that can be used with the memory array 101 of FIG. 1. The m-bit encoding and decoding block 303 encodes data received over the Input/Output (I/O) connections 307 and decodes data from the memory array 101. The encoding and decoding can be accomplished using a function (e.g., mathematical function).

The value of "m" of the encoding and decoding block 303 determines the number of memory cells within the array 101 to be programmed with the encoded data. The m-cell encoding and decoding block 303 can be implemented in software, hardware, or both software and hardware.

The function to be used in encoding the data can be stored in the functional storage 305. The functional storage 305 can be some type of memory (e.g., ROM or flash memory) that is resident on the memory device. In another embodiment, the functional storage can be separate from the memory device and the one or more functions can be used to generate particular patterns that can be used by the encoding and decoding block 303 as described subsequently with reference to FIG. 4.

In one embodiment, the functional storage 305 can choose a function appropriate to specific characteristics of the memory device and architecture in response to changing memory parameters. A different function can be chosen to encode/decode data in response to changing memory parameters (e.g., noise, memory aging) and/or to reduce charge storage structure-to-charge storage structure coupling and improve write performance. For example, one function might provide better noise immunity than other functions. Thus, if a read/verify of the memory detects that the reliability of programming of memory cells is degraded due to a greater than normal noise condition, a new function can be chosen to improve noise immunity. Similarly, as memory cells age (e.g., experience an increased number of program/erase cycles), their programming characteristics change. A different function can be selected to encode/decode data so as to compensate for the changing programming characteristics.

In one embodiment, the functional storage 305 can be implemented outside of the memory integrated circuit and the patterns generated by the one or more functions could then be stored within the memory integrated circuit. In another embodiment, both the functional storage and the patterns generated by the one or more functions can be stored within the memory integrated circuit.

The number of cells "m" that are programmed as part of the group of memory cells can also be changed as needed to increase/decrease the resolution of the error correction coding inherently provided by the functional programming. A larger "m" can provide improved ECC over a smaller "m" at the expense of reduced memory density.

The encoding and decoding block 303 can also provide decoding of data read from the memory array 101. The already encoded data from the array 101 can be decoded using the same function used to encode it. Thus, the data are read from the memory array, decoded by the decoding block 303 and output over the I/O connections 307.

Figure 4:
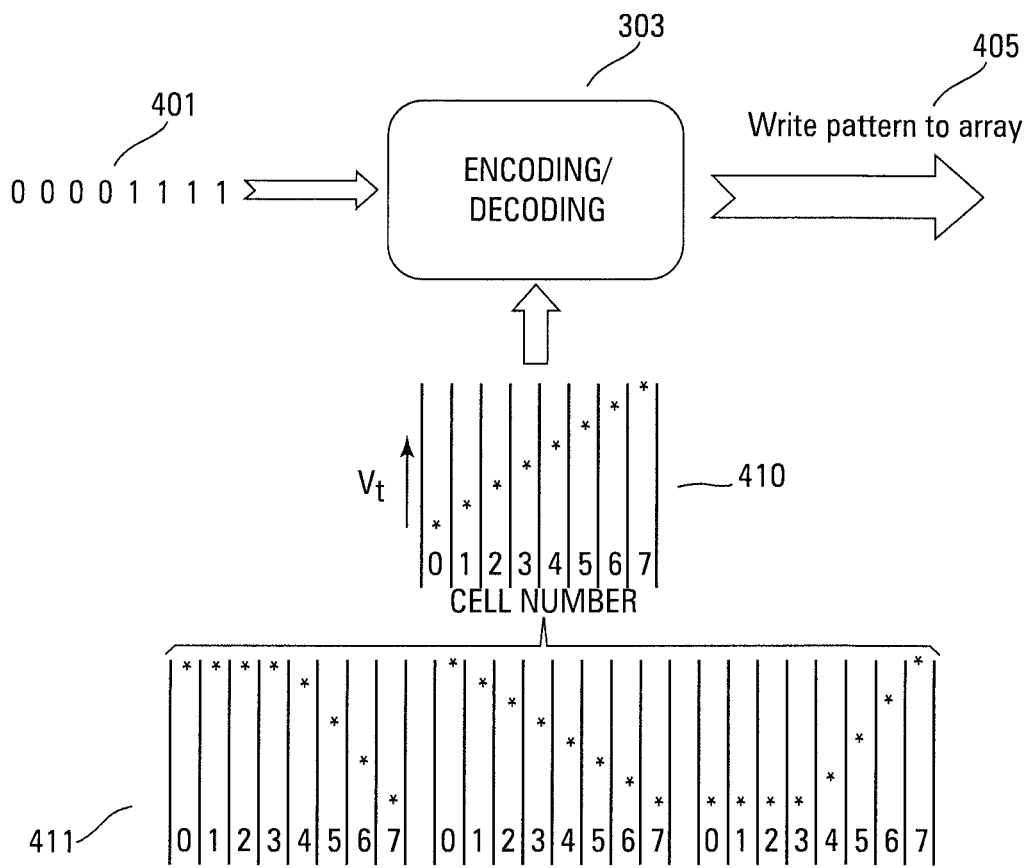
FIG. 4 shows a block diagram of one embodiment of encoding and decoding of data using pattern recognition in accordance with the embodiment of FIG. 3.

FIG. 4 illustrates another embodiment for functionally encoding and decoding data using pattern writing and pattern recognition. This embodiment can be executed within the encoding and decoding block 303 of FIG. 3.

In the embodiment of FIG. 4, one or more functions are used to generate a plurality of particular patterns 411 that can be stored in the memory device. Each pattern is generated by a particular function operating on a particular group of data. For example, assuming a group of data comprises eight digits (e.g., bits) 401, data comprising 00001111 would have one particular pattern 410 that is used to represent that particular group of data. Thus, the embodiment of FIG. 4 uses pattern matching to both encode data to be programmed to the memory array and decode data from the memory array. The choice of the optimum set of functions depends on memory array architecture and process technology and is the key factor enabling better and more reliable data storage. This choice and determination of the set of functions is known to those skilled in the art.

Each particular group of bits with its corresponding representative pattern is stored for subsequent decoding of the data read from the memory array. A table of particular groups of bits and each of their corresponding representative patterns can be stored in a table in memory.

Referring to the example pattern 410 of FIG. 4, it can be seen that each pattern is a matrix of cell numbers along the bottom and $V_t$ levels. The example pattern 410 shows an increasing $V_t$ for each subsequent cell from cell 0 to cell 7 of the eight cell pattern. Thus, each pattern is a particular pattern of cell numbers and threshold voltages within a particular group of cells.

As an example encoding operation, input data 401 from the I/O connections is input to the encoding and decoding block 303. The input data 401 is grouped into a particular group of bits (e.g., 8 bits) for selection of the particular pattern 410, from a plurality of patterns 411, that has been assigned to represent that particular group of bits. This pattern is then programmed to the memory array 405 as the pattern of threshold voltages.

A decode operation operates in a reverse fashion from the encode operation. The data are read from the memory array as a particular pattern of threshold voltages. This pattern is then matched in the decoding block 303 to determine the particular group of data that the pattern represents. The group of data is then output over the I/O connections to the user. In an alternate embodiment, the pattern is operated on by an inverse function to the function that originally encoded the data in order to generate the group of data.

FIG. 5 illustrates a table of one embodiment for encoding groups of data to eight memory cells. This table is for purposes of illustration only since any of the illustrated parameters (e.g., A, B, n) can change for different embodiments.

For example, in the illustrated embodiment, A is a constant while B is a variable. Alternate embodiments can have a constant B while A is the variable or both A and B can be variables. The values of A and B can be determined based on a combination of the mathematical function used, the memory technology (e.g., floating gate), and/or the problem being addressed by the encoding (e.g., noise, aging, coupling).

The table of FIG. 5 is a tabular representation of the graph of FIG. 2A. The table includes columns for the values of parameters A and B as described previously. The table also includes columns for the threshold voltage b(m) (e.g., b(1)-b(8)) for each of the eight memory cells being programmed, where "m" is the $m^{th}$ cell in the group of cells being encoded and b(m) is the threshold voltage for each of the memory cells, of a particular function, that results from the encoding process.

The table further includes columns for the functional variation (e.g., 1-8) and the number of bits each of those variations can be used to represent. Each functional variation represents what data is being encoded. For example, functional variation 1 might represent a binary "00000001" and functional variation 2 might represent a binary "00000010".

In the embodiment of FIG. 5, using the values of A, B, and n from the table, the mathematical function b(m)=A*exp (B*m−cell) was used to generate the threshold voltage for each physical cell from 1 to m, where "m−cell" is the $m^{th}$ cell in the group of cells. The resulting threshold voltages for each memory cell are plotted in the graph of FIG. 2A.

Alternate embodiments can use functions other than the exponential function used in FIG. 5. For example, the function A*sin(B*m−cell) could be used to encode a group of bits to generate the threshold voltage for each memory cell. The resulting encoded data from this function is shown in the graph of FIG. 2D.

Figure 6:
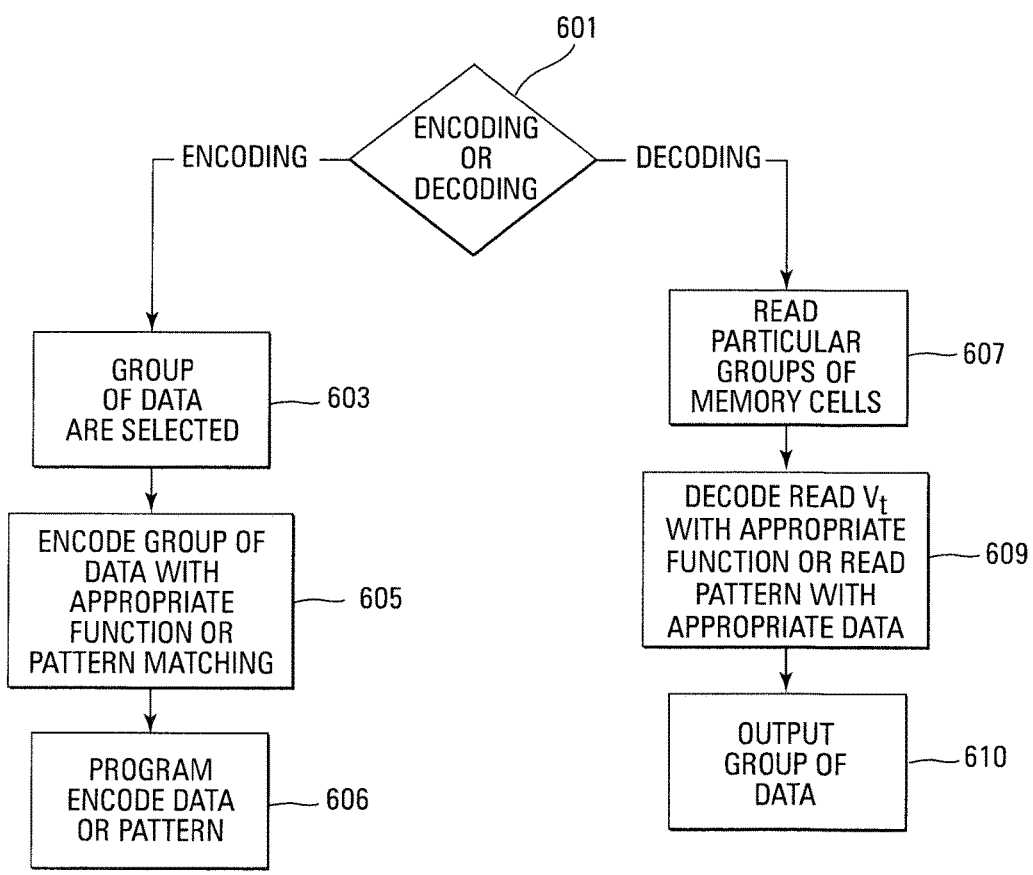
FIG. 6 shows a flowchart of one embodiment of a method for functional data programming and reading in a memory.

FIG. 6 illustrates a flowchart of one embodiment of a method for encoding and decoding data in a memory device. A determination is initially made whether a decoding operation or an encoding operation is to be performed 601.

If an encoding operation is to be performed, a group of data are selected having a particular quantity of bits 603. The quantity of cells for each group of data can be selected as a balance between resolution of the function, error sensitivity, and/or desired storage density in the memory device.

The group of data can then be encoded 605 by matching the data with a representative pattern of threshold voltages (e.g., indirectly using a function) or by encoding the data using an appropriate function (e.g., directly using a function), as discussed previously. The encoded data can then be programmed to the memory cells 606.

If a decoding operation is to be performed, a read operation is performed on a particular group of memory cells 607 that includes data that was functionally stored. The read operation reads a particular pattern of threshold voltages for each of a plurality of memory cells in the group of memory cells. The pattern of read threshold voltages can then be decoded 609 by using an inverse of the function used to encode the data or by comparing the read pattern of threshold voltages with a plurality of particular patterns to determine which pattern matches. The group of data associated with the matching pattern is the decoded data. The group of decoded data can then be output 610.

The method for encoding and decoding data can be used in 3-D NAND or other storage devices that store information by variable electrical or physical property values on memory elements. In the case of a 3D memory, one could cross the 2-dimensional plane in choosing the group of m-cells that could store the n-bits of data. In this case, the mathematical functions or patterns could take lines, surfaces or volume representations.

Figure 7:
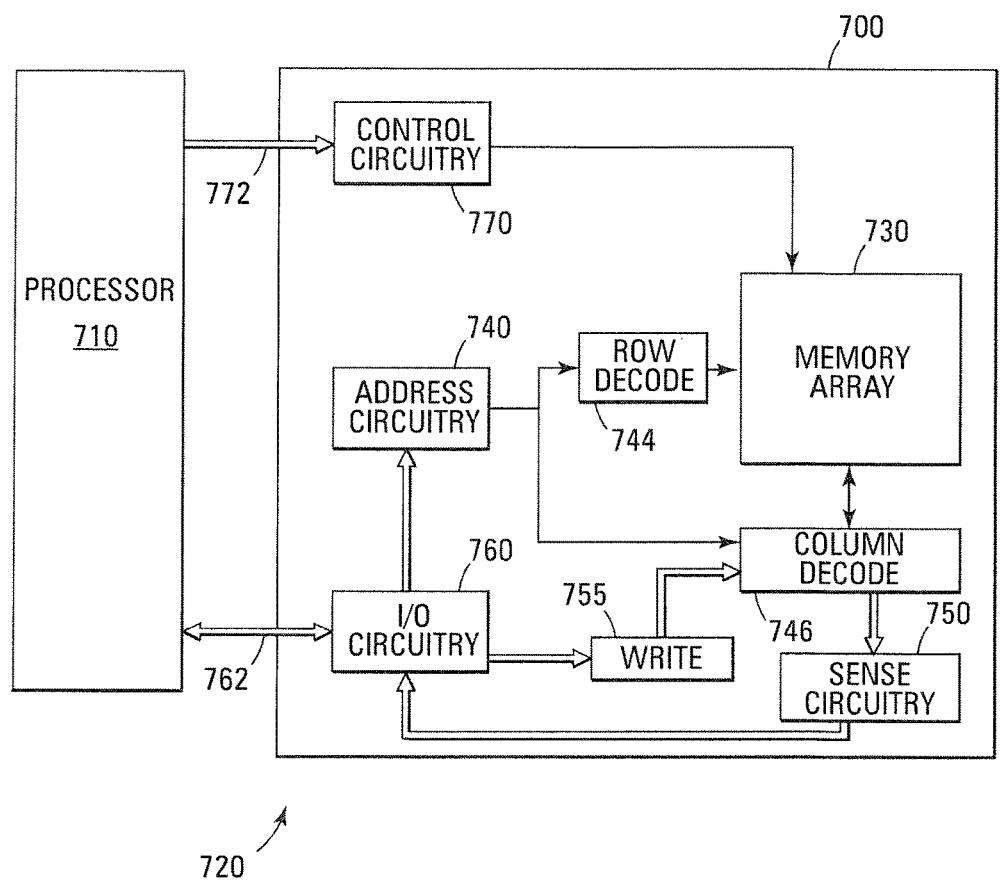
FIG. 7 shows a block diagram of one embodiment of a system that can incorporate the method for functional data programming and reading.

FIG. 7 illustrates a functional block diagram of a memory device 700 as part of a memory system 720. The memory device 700 is coupled to a controller 710. The controller 710 may be a microprocessor or some other type of controlling circuitry. The memory device 700 has been simplified to focus on features of the memory that are helpful in understanding the present invention.

The memory device 700 includes an array 730 of non-volatile memory cells, such as the one illustrated previously in FIG. 1. The memory array 730 is arranged in banks of word line rows and bit line columns. In one embodiment, the columns of the memory array 730 are comprised of series strings of memory cells as illustrated in FIG. 1. As is well known in the art, the connections of the cells to the bit lines determines whether the array is a NAND architecture, an AND architecture, or a NOR architecture.

Address buffer circuitry 740 is provided to latch address signals provided through the I/O circuitry 760. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense circuitry. The sense circuitry 750, in one embodiment, is coupled to read and latch a row of data from the memory array 730. The sense circuitry 750 can include the page buffers as described herein. Data input and output buffer circuitry 760 is included for bidirectional data communication as well as address communication over a plurality of data connections 762 with the controller 710. Write circuitry 755 is provided to write data to the memory array.

Memory control circuitry 770 decodes signals provided on control connections 772 from the controller 710. These signals are used to control the operations on the memory array 730, including data read, data write (program), and erase operations. The memory control circuitry 770 may be a state machine, a sequencer, or some other type of control circuitry to generate the memory control signals. In one embodiment, the memory control circuitry 770 is configured to execute the embodiments for encoding and decoding.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, one or more embodiments of the disclosed methods for functional programming and reading in a memory can encode and decode data using a function either directly or indirectly. The functionally encoded data can be programmed to memory and may result in reduced effects from coupling and disturb and reduced use of error correction coding.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A method of operating a memory, comprising:
   receiving a plurality of digits of data;
   determining a value of the plurality of digits of data;
   selecting a function to represent the value of the plurality of digits of data, wherein the selected function is a non-binary mathematical function of a cell number of each memory cell within a grouping of memory cells;
   determining a desired threshold voltage of each memory cell of the grouping of memory cells in response to the selected function, wherein the desired threshold voltage of a particular memory cell of the grouping of memory cells corresponds to the value of the selected function for the cell number of the particular memory cell; and
   programming the particular memory cell to its desired threshold voltage.

2. The method of claim 1, wherein selecting the function comprises selecting the function from a plurality of functions, wherein each function of the plurality of functions is a function of a cell number of each memory cell within the grouping of memory cells.

3. A method of operating a memory, comprising:
   receiving a plurality of digits of data;
   determining a value of the plurality of digits of data,
   selecting a function to represent the value of the plurality of digits of data, wherein the selected function is a function of a cell number of each memory cell within a grouping of memory cells;
   determining a desired threshold voltage of a particular memory cell of the grouping of memory cells in response to the selected function, wherein the desired threshold voltage corresponds to the value of the selected function for the cell number of the particular memory cell; and
   programming the particular memory cell to its desired threshold voltage;
   wherein selecting the function comprises selecting the function from a plurality of functions, wherein each function of the plurality of functions is a function of a cell number of each memory cell within the grouping of memory cells; and
   wherein each value of each function of the plurality of functions is calculated independent of any value of the plurality of digits of data.

4. A method of operating a memory, comprising:
   receiving a plurality of digits of data;
   determining a value of the plurality of digits of data;
   selecting a function to represent the value of the plurality of digits of data, wherein the selected function is a function of a cell number of each memory cell within a grouping of memory cells;
   determining a desired threshold voltage of a particular memory cell of the grouping of memory cells in response to the selected function, wherein the desired threshold voltage corresponds to the value of the selected function for the cell number of the particular memory cell; and
   programming the particular memory cell to its desired threshold voltage;
   wherein selecting the function comprises selecting the function from a plurality of functions, wherein each function of the plurality of functions is a function of a cell number of each memory cell within the grouping of memory cells, and
   wherein one function of the plurality of functions is a different type of function than an other function of the plurality of functions.

5. The method of claim 4, wherein the one function is of a type selected from a group consisting of an exponential function and a periodic function.

6. The method of claim 4, wherein at least one function of the plurality of functions is of a type other than an exponential function or a periodic function.

7. A method of operating a memory, comprising:
   receiving a plurality of digits of data;
   determining a value of the plurality of digits of data;
   selecting a function to represent the value of the plurality of digits of data, wherein the selected function is a function of a cell number of each memory cell within a grouping of memory cells;
   determining a desired threshold voltage of a particular memory cell of the grouping of memory cells in response to the selected function, wherein the desired threshold voltage corresponds to the value of the selected function for the cell number of the particular memory cell; and programming the particular memory cell to its desired threshold voltage;

wherein selecting the function comprises selecting the function from a plurality of functions, wherein each function of the plurality of functions is a function of a cell number of each memory cell within the grouping of memory cells; and wherein the selected function is of a form having at least one parameter, the method further comprising:

determining the desired threshold voltage of the particular memory cell using the selected function and using a particular value of a particular parameter of the at least one parameter;

wherein an other function of the plurality of functions is of the form of the selected function, but using a second value of the particular parameter different than the particular value of the particular parameter.

8. The method of claim 7, further comprising:

determining the desired threshold voltage of the particular memory cell using the selected function and using the particular value of the particular parameter, and using a particular value of a different parameter of the at least one parameter; and wherein the other function of the plurality of functions uses the second value of the particular parameter, and uses the particular value of the different parameter.

9. A method of operating a memory, comprising:

receiving N digits of data for programming into M memory cells, wherein M and N are integer values greater than or equal to 2;

determining a value of the N digits of data;

selecting a function to represent the value of the N digits of data, wherein the selected function is a non-binary mathematical function of a cell number m of the memory cells of the M memory cells, wherein m is any integer value from 1 to M;

determining a respective desired threshold voltage for each memory cell of the M memory cells in response to the selected function, wherein each respective desired threshold voltage corresponds to a value of the selected function for the cell number of its respective memory cell; and programming each memory cell of the M memory cells to its respective desired threshold voltage.

10. A method of operating a memory, comprising:

receiving N digits of data for programming into M memory cells, wherein M and N are integer values greater than or equal to 2;

determining a value of the N digits of data;

selecting a function to represent the value of the N digits of data, wherein the selected function is a function of a cell number m of the memory cells of the M memory cells, wherein m is any integer value from 1 to M;

determining a respective desired threshold voltage for each memory cell of the M memory cells in response to the selected function, wherein each respective desired threshold voltage corresponds to a value of the selected function for the cell number of its respective memory cell; and programming each memory cell of the M memory cells to its respective desired threshold voltage;

wherein each value of the selected function is calculated independent of the value of the N digits of data.

11. The method of claim 9, wherein a plurality of memory cells of the M memory cells each have a respective control gate coupled to a same access line.

12. The method of claim 9, wherein a plurality of memory cells of the M memory cells are each selectively connected to a same data line.

13. The method of claim 9, wherein receiving the N digits of data for programming into the M memory cells comprises receiving the N digits of data where N is greater than M.

14. The method of claim 9, wherein receiving the N digits of data for programming into the M memory cells comprises receiving the N digits of data where N is less than M.

15. The method of claim 9, wherein selecting the function comprises selecting the function from a plurality of functions, wherein each function of the plurality of functions is a function of the cell number m of the memory cells of the M memory cells.

16. A method of operating a memory, comprising:

receiving N digits of data for programming into M memory cells, wherein M and N are integer values greater than or equal to 2;

determining a value of the N digits of data;

selecting a function to represent the value of the N digits of data, wherein the selected function is a function of a cell number m of the memory cells of the M memory cells, wherein m is any integer value from 1 to M;

determining a respective desired threshold voltage for each memory cell of the M memory cells in response to the selected function, wherein each respective desired threshold voltage corresponds to a value of the selected function for the cell number of its respective memory cell; and programming each memory cell of the M memory cells to its respective desired threshold voltage;

wherein selecting the function comprises selecting the function from a plurality of functions, wherein each function of the plurality of functions is a function of the cell number m of the memory cells of the M memory cells; and wherein each value of each function of the plurality of functions is calculated independent of any value of the N digits of data.

17. The method of claim 15, wherein a number of functions of the plurality of functions is equal to $2^N$.

18. The method of claim 17, wherein receiving the N digits of data for programming into the M memory cells comprises receiving the N digits of data where N is not equal to M.

19. The method of claim 9, wherein determining the respective desired threshold voltage for each memory cell of the M memory cells in response to the selected function comprises determining M different values of threshold voltage.

20. A method of operating a memory, comprising:

receiving N digits of data for programming into M memory cells, wherein M and N are integer values greater than or equal to 2;

determining a value of the N digits of data;

selecting a function to represent the value of the N digits of data from a plurality of functions, wherein each function of the plurality of functions is a function of a cell number m of the memory cells of the M memory cells, wherein m is any integer value from 1 to M, wherein each value of the selected function is calculated independent of the value of the N digits of data;

determining a respective desired threshold voltage for each memory cell of the M memory cells in response to the selected function, wherein each respective desired threshold voltage corresponds to a value of the selected function for the cell number of its respective memory cell; and programming each memory cell of the M memory cells to its respective desired threshold voltage.

21. The method of claim 20, wherein a number of functions of the plurality of functions is equal to a number of possible values that can be represented by the N digits of data.

* * * * *